US011723172B2

(12) United States Patent
Aiello et al.

(10) Patent No.: US 11,723,172 B2
(45) Date of Patent: Aug. 8, 2023

(54) FAN IMPELLER WITH SECTIONS HAVING DIFFERENT BLADE DESIGN GEOMETRIES

(71) Applicant: Apple Inc., Cupertino, CA (US)

(72) Inventors: Anthony Joseph Aiello, Santa Cruz, CA (US); Brett W. Degner, Menlo Park, CA (US); Jesse T. Dybenko, Santa Cruz, CA (US); Arash Naghib Lahouti, San Jose, CA (US); Eric R. Prather, Portola Valley, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/448,700

(22) Filed: Sep. 23, 2021

(65) Prior Publication Data

US 2022/0287202 A1  Sep. 8, 2022

Related U.S. Application Data

(60) Provisional application No. 63/157,587, filed on Mar. 5, 2021.

(51) Int. Cl.
*F04D 29/28*  (2006.01)
*H05K 7/20*  (2006.01)
(Continued)

(52) U.S. Cl.
CPC ......... *H05K 7/20172* (2013.01); *F04D 17/16* (2013.01); *F04D 29/281* (2013.01); *F04D 29/30* (2013.01)

(58) Field of Classification Search
CPC ........ F04D 17/16; F04D 29/281; F04D 29/30; F04D 29/282; F04D 29/424;
(Continued)

(56) References Cited

U.S. PATENT DOCUMENTS 2,991,004 A * 7/1961 Denbo ................. F04D 29/282
416/243
4,324,529 A * 4/1982 Nickels ................ F04D 29/283
416/187
(Continued)

FOREIGN PATENT DOCUMENTS

CN          2575336 Y   *  9/2003
CN        108386382 A   *  8/2018    ........... F04D 29/282
(Continued)

*Primary Examiner* — J. Todd Newton
*Assistant Examiner* — Wayne A Lambert
(74) *Attorney, Agent, or Firm* — BakerHostetler

(57) ABSTRACT

Fan assemblies are disclosed. Fan assemblies include an impeller with asymmetric design. For example, an impeller may include a first set of blades with one geometry and second set of fan blades with another geometry. This enables a dual-inlet centrifugal fan to generate different air flow performance characteristics for the air entering one fan inlet compared to the air entering the other fan inlet. The impeller, with different fan blade configurations, can better handle air flow entering the fan assembly through different inlets, particularly when the air flow conditions differ through the inlets due to impeding structures (e.g., motor, struts, etc.). As a result, air flow distribution from air leaving the impeller, including the locations associated with the different fan blade configurations, is relatively uniform. Beneficially, when air flow distribution uniformity increases, the fan assembly operates more efficiently, as air flow pressure losses due to flow separation are mitigated.

18 Claims, 12 Drawing Sheets

(51) Int. Cl.
*F04D 29/30* (2006.01)
*F04D 17/16* (2006.01)

(58) Field of Classification Search
CPC .............. F04D 25/0606; F04D 25/166; H05K 7/20172; H05K 7/20972; G06F 30/15; G06F 30/20
See application file for complete search history.

(56) References Cited

U.S. PATENT DOCUMENTS

| | | | | |
|---|---|---|---|---|
| 5,988,979 | A * | 11/1999 | Wang | F04D 29/283 416/200 R |
| 6,158,954 | A * | 12/2000 | Nabeshima | F04D 17/04 416/178 |
| 6,488,472 | B1 | 12/2002 | Miyazawa | |
| 6,540,476 | B2 * | 4/2003 | Huang | F04D 29/424 416/185 |
| 6,877,954 | B2 * | 4/2005 | Lin | F04D 29/30 416/185 |
| 7,044,720 | B1 | 5/2006 | Yamamoto et al. | |
| 7,210,907 | B2 * | 5/2007 | Patti | F04D 29/30 416/178 |
| 7,300,244 | B2 | 11/2007 | Baugh et al. | |
| 7,417,856 | B2 * | 8/2008 | Chiu | F04D 17/16 361/695 |
| 7,918,651 | B2 * | 4/2011 | Jiang | F04D 29/282 415/178 |
| 8,333,547 | B2 * | 12/2012 | Hsu | F04D 25/166 415/60 |
| 8,684,676 | B1 * | 4/2014 | Kirkpatrick | F04D 29/281 415/206 |
| 9,145,897 | B2 * | 9/2015 | Wu | F04D 29/30 |
| 9,261,108 | B2 * | 2/2016 | Van Deventer | F04D 29/283 |
| 10,935,039 | B2 * | 3/2021 | Kedelty | F04D 29/281 |
| 2013/0084187 | A1 * | 4/2013 | Wu | F04D 17/162 416/189 |
| 2014/0072434 | A1 * | 3/2014 | Wu | F04D 29/666 416/198 R |
| 2017/0002836 | A1 * | 1/2017 | Herrou | F04D 29/281 |
| 2018/0238351 | A1 * | 8/2018 | Kono | F04D 29/281 |
| 2018/0352676 | A1 * | 12/2018 | Degner | H05K 7/20154 |
| 2019/0136866 | A1 * | 5/2019 | Kedelty | F04D 29/30 |
| 2020/0224672 | A1 | 7/2020 | Lin et al. | |

FOREIGN PATENT DOCUMENTS

| | | | |
|---|---|---|---|
| DE | 102014220388 A1 * | 4/2016 | |
| JP | 4621980 B2 | 2/2011 | |
| WO | WO-2008066915 A1 * | 6/2008 | ........... F04D 29/188 |
| WO | WO-2018075635 A1 * | 4/2018 | ........... F04D 17/162 |

* cited by examiner

FAN IMPELLER WITH SECTIONS HAVING DIFFERENT BLADE DESIGN GEOMETRIES

CROSS-REFERENCE TO RELATED APPLICATIONS

The present application claims the benefit of U.S. Provisional Application No. 63/157,587, entitled "FAN IMPELLER WITH SECTIONS HAVING DIFFERENT BLADE DESIGN GEOMETRIES," filed Mar. 5, 2021, the content of which is incorporated herein by reference in its entirety for all purposes.

FIELD

The present embodiments relate generally to fans, including centrifugal fans with impellers. More particularly, the present embodiments relate to fans with impellers divided into multiple sections, with each section having impeller blades with different geometries. The respective geometries of the impeller blades are designed to optimize fan performance and mitigate issues associated with unwanted flow separation and fan noise.

BACKGROUND

Electronic devices often include multiple processors designed to execute several functions and run various programs. Recent advances in processor technology (e.g., additional cores) allow processors to run at higher speeds, thus increasing the overall functionality of an electronic device. However, one drawback to increased processing capabilities is the associated increase in thermal energy generated by the processors, which is known to damage some sensitive components, including the processors themselves, of the electronic device. In order to dissipate this heat, significant air flow needs to be driven through the device using a cooling fan, and the resulting acoustic noise of this air flow can become problematic if addressed using conventional means.

One solution is to alter the fan control and allow an impeller (of the fan) to run at higher rotational speeds, thereby increasing the air flow circulation within the electronic device. While increased air flow may enhance the cooling effect, it can cause other issues. For example, some fans with multiple fan inlets are known to generate non-uniform air flow distribution due to different conditions at the fan inlets, which can lead to issues such as air flow separation and unwanted acoustic noise. Air flow separation can lead to decreased fan efficiency and increase the acoustic noise for a given air flow rate, leading to an overall degraded user experience of the electronic device.

SUMMARY

This paper describes various embodiments that relate to fan assemblies with an impeller that includes an asymmetric geometry based on one or more differences in impeller blade design of two independent sets of impeller blades.

According to some aspects of the present disclosure, an electronic device is described. The electronic device may include a housing that defines an internal volume. The electronic device may further include a fan assembly located in the internal volume. The fan assembly may include an impeller. The impeller may include a first set of impeller blades having a first blade geometry. The impeller may further include a second set of impeller blades having a second blade geometry different from the first blade geometry. Accordingly, the first set of impeller blades may include one or more impeller blades with the first blade geometry, and the second set of impeller blades may include one or more impeller blades with the second blade geometry. The impeller may further include a separating structure, which may include a disc (as a non-limiting example), that separates the first impeller blade from the second impeller blade.

According to some aspects of the present disclosure, an electronic device is described. The electronic device may include a housing that defines an internal volume. The electronic device may further include a display coupled with the housing. The electronic device may further include a heat-generating component located in the internal volume. The electronic device may further include a fan assembly located in the internal volume and configured to cool the heat-generating component. The fan assembly may include a fan housing that defines a first fan inlet, a second fan inlet, and a fan outlet. The fan assembly may further include an impeller located in the fan housing. The impeller may include a separating structure that includes a first surface and a second surface opposite the first surface. The impeller may further include a first set of impeller blades extending from the first surface and aligned with the first fan inlet. The first set of impeller blades may include a first impeller blade geometry. The fan assembly may include a second set of impeller blades extending from the second surface and aligned with the second fan inlet. The second set of impeller blades may include a second impeller blade geometry different from the first impeller blade geometry.

According to some aspects of the present disclosure, a fan impeller for cooling one or more heat-generating components of an electronic device is described. The fan impeller may include a first set of impeller blades having a first blade geometry. The fan assembly may further include a second set of impeller blades having a second blade geometry different from the first blade geometry. The fan assembly may further include a separating structure that separates the first set of impeller blades from the second set of impeller blades.

For impellers described herein, the various differences in impeller blade geometries between two sets of impeller blades of an impeller may include a difference in leading edge angle, trailing edge, blade inlet diameter, blade outlet diameter, number of blades, blade angular position (with respect to a reference angle), or some combination thereof.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
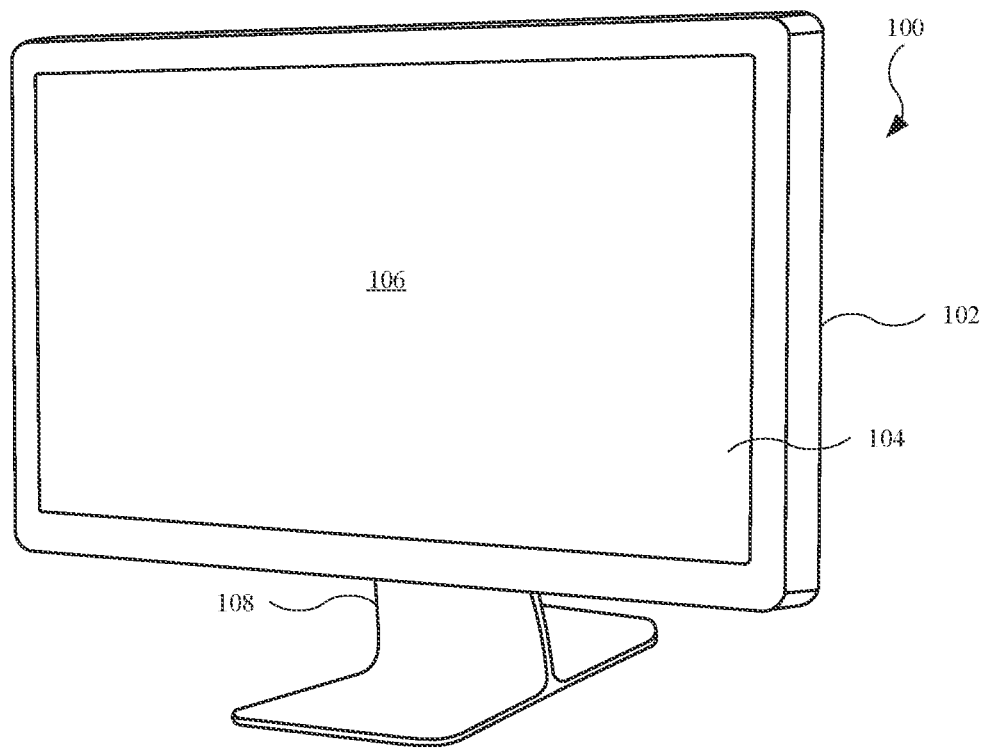
FIG. 1 illustrates a front isometric view of an embodiment of an electronic device, in accordance with some described embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The following disclosure relates to modified impellers for fan assemblies used in devices, such as electronic devices including desktop computing devices, displays, and all-in-one computers with display and processing units carried by a single housing, as non-limiting examples. During operation, a fan assembly (e.g., centrifugal fan) uses an impeller to pull air through multiple inlets of the fan assembly, and subsequently expel the air through a fan outlet. Depending on the orientation and integration in an electronic device, a fan assembly (or assemblies) can be used to drive air through a heat-exchanging component (e.g., fin stack) thermally coupled to a thermal module prior to the air exiting the electronic device, or to convectively cool a heat-generating component (e.g., integrated circuit).

There are several challenges associated with current fan assemblies, particularly those with multiple fan inlets. For example, fan assemblies use a fan motor (a brushless DC motor, as a non-limiting example) to rotationally drive the impeller, with the fan motor seated on a platform attached by multiple struts. In the case of a dual-inlet fan assembly, one of the inlets is impeded or partially obstructed by one or more structures of the fan assembly, such as the fan motor platform and the supporting struts, while the other inlet is generally unimpeded. During operation of the fan assembly, air intake through the unimpeded fan inlet is greater than that of the impeded fan inlet. This results in non-uniform air distribution, as the air velocity exiting a region of the impeller associated with the unimpeded fan inlet is different from (e.g., greater than) the air velocity exiting a region of the impeller associated with the impeded fan inlet. Non-uniform air flow distribution can cause pressure losses and unwanted flow separation at the fan outlet duct. Consequently, the fan assembly tends to run inefficiently, as recirculation of air in the fan assembly can occur. Additionally, the resultant air flow issues (such as flow separation in the outlet duct, or inefficient operation of the upper and/or lower parts of the impeller) can cause elevated levels audible noise, which is undesirable to a user of the electronic device. While ordinary impellers without independent top and bottom blades may have some blade shaping adjustments to mitigate these issues, the blade shaping adjustment(s) in an ordinary impeller would be equally applied to the entire height of the blade and cannot be precisely tailored to the top or bottom half flow conditions.

The impellers described herein are modified to include different impeller blade geometries to address the air flow differences through the fan inlets. For example, an impeller may include one set of impeller blades associated with (i.e., aligned with, or situated next to) the unimpeded fan inlet, as well as another set of impeller blades associated with the impeded fan inlet. These two sets of impeller blades can be independent from each other, both physically and in terms of blade geometry. For example, a first set of impeller blades associated with the unimpeded fan inlet may include impeller blades, each with a particular geometry, while a second set of impeller blades associated with the impeded fan inlet may include impeller blades, each with a different geometry as compared to that of the first set of impeller blades. The geometric differences may include a variety of factors, including differences in leading edge angle and/or trailing edge angle of the impeller blades. Accordingly, the impellers blades of the aforementioned first set of impeller blades may be shaped and oriented differently than those of the aforementioned second set of impeller blades. Furthermore, the top parts (or first set of impeller blades) and bottom parts (or second set of impeller blades) of the impeller might have different number of blades in the respective sets of blades. Additionally, impellers described herein may include a separating structure, or disc, that defines a physical separation between the first and second sets of impeller blades. Moreover, the position of the separating structure defines the respective blade lengths of the first and second sets of impeller blades, which can control the ratio of air flow rate through one fan inlet relative to the air flow rate through the other. For example, when the separating structure is not positioned at the midpoint of the impeller, one set of blade lengths is longer than the other set, and the longer set of impeller blades can drive more air through one inlet (closer to the longer impeller blades) than the shorter impeller blades. Depending upon the desired flow characteristics, the longer blades can be aligned with, and positioned closer to, the impeded or unimpeded inlet. Alternatively, or in combination, additional differences between the impeller blades of the first and second set of impeller blades may include differences in size, shape, blade curvature, blade inner diameter, blade leading-edge angle (e.g., relative to a common reference), blade trailing-edge angle (e.g., relative to a common reference) or trailing-edge blade angle, angular spacing between impeller blades (e.g., between adjacent impeller blades), angular offset between the two sets of impeller blades, and/or number of blades, as non-limiting examples. A blade leading-edge angle and a blade trailing-edge angle may be referred to as a leading-edge blade angle and a trailing-edge blade angle. Regarding impeller blade spacing, variable spacing applied to each set of impeller blades can be equal in some embodiments, and different in other embodiments. In addition, for an impeller with two independent sets of impeller blades, one set of impeller blades may be offset angularly with respect to another set of impeller blades by an amount equal to the nominal angular spacing between adjacent blades (i.e. one full blade pitch) or a fraction thereof (i.e. a fraction of a pitch).

Beneficially, a single, asymmetric impeller with two different sets of impeller blades, each having their own unique characteristics, can address issues associated with air flow differences of fan inlets with unequal impedances and/or upstream conditions. For instance, the modified impeller can limit unwanted flow separation in the impeller blade channel and/or the fan outlet duct, thereby mitigating recirculation and acoustic noise. Moreover, by mitigating recirculation, a fan assembly, using the modified impeller, can increase efficiency in terms of air flow through the fan assembly. Further, having different blade geometry between the inlets with different impedances could correct air flow velocity deficits seen downstream of the respective sets of impeller blades, and create a more uniform velocity distribution in the fan outlet duct resulting in more efficient, quieter delivery of air flow. The various aforementioned differences (e.g., geometries, etc.) may correspond to alterable/adjustable factors for impeller design, and each factor(s) can be evaluated via computer simulations and/or empirical trials to optimize air flow and reduce acoustic noise.

In some embodiments, the impeller is manufactured through a molding operation, such as injection molding, as a non-limiting example. In this regard, the molding operation may use two mold cavities, each with different designs, to achieve two different sets of impeller blades. Further, due to the molding operation, the impeller may represent a single-piece and/or monolithic impeller formed from a polymer material. Alternatively, the impeller may represent a single-piece, molded structure formed from one or more polymer materials. In order to mold an impeller with two different of blades, the separating structure can extend laterally to the outer edges, which may correspond to respective trailing edges, of each set of blades. Moreover, the separating structure not only defines a physical separation between the respective sets of impeller blades, but also a buffer that limits or prevents air flow received from the fan inlets from immediate, or near-immediate, interaction.

Other structural enhancements may be integrated with fan assemblies described herein for further optimization. For example, a fan assembly may include an air flow separator, or plate, integrated with the fan housing. The air flow separator surrounds the impeller, without making contact, and limits or prevents the respective air flow from the two sets of impeller blades from unwanted interaction.

These and other embodiments are discussed below with reference to FIGS. 1-16. However, those skilled in the art will readily appreciate that the detailed description given herein with respect to these figures is for explanatory purposes only and should not be construed as limiting.

FIG. 1 illustrates a front isometric view of an embodiment of an electronic device 100. As shown, electronic device 100 may include an enclosure 102, or housing, that defines an internal volume designed to carry several internal components including, as non-limiting examples, processing circuitry (such as a central processing unit and a graphics processing unit), memory circuits, circuit boards, audio components such as speakers and microphones, a battery, and flexible circuitry that connects together the aforementioned components.

Electronic device 100 may further include a display 104 coupled with enclosure 102. Display 104 may include a light emitting diode ("LED") display or a plasma display, as a non-limiting example. In order to protect display 104, electronic device 100 may further include a transparent layer 106 that covers display 104. Transparent layer 106 may include glass, plastic, or sapphire, as non-limiting examples. Electronic device 100 may further include a stand 108 that is rotationally coupled to enclosure 102, thereby allowing enclosure 102, and in particular display 104, to rotate relative to stand 108.

Figure 2:
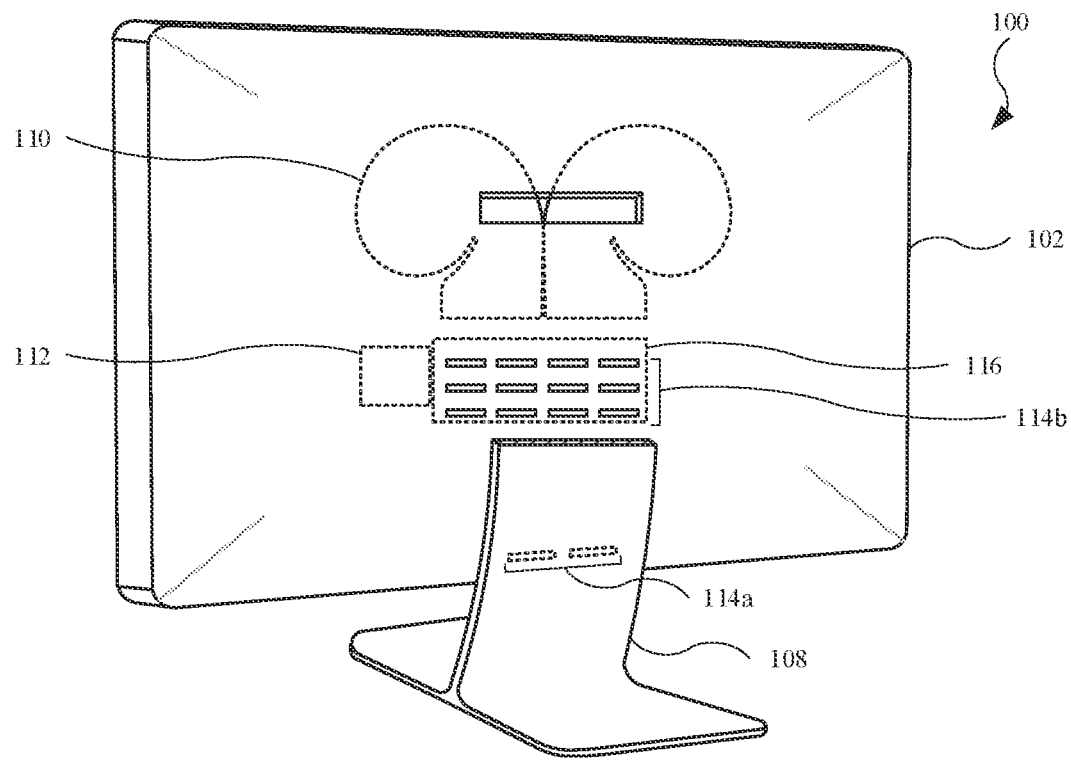
FIG. 2 illustrates a rear isometric view of the electronic device shown in FIG. 1.

FIG. 2 illustrates a rear isometric view of electronic device 100 shown in FIG. 1. For purposes of illustration, a portion of stand 108 is removed. As shown, electronic device 100 includes a fan assembly 110 and a heat-generating component 112, both of which are positioned in the internal volume of enclosure 102. The respective positions shown in FIG. 2 are exemplary, and other positions are possible. Enclosure 102 may include openings 114a, or through holes, used as air inlet vents allowing air to enter and circulate within enclosure 102. During operation of electronic device 100, heat-generating component 112 (representative one or more heat-generating components) undergoes a temperature increase and heats the surrounding air within the internal volume. In order to cool heat-generating component 112, electronic device 100 may activate fan assembly 110 to direct the heated air away from heat-generating component 112. Further, fan assembly 110 can drive the heated air to a heat exchanger 116, and heat exchanger 116 can subsequently exhaust thermal energy (provided by the heat air) out of electronic device 100 through openings 114b (formed in enclosure 102) used as air outlet vents. Generally, openings 114a and 114b are hidden by stand 108.

In order to increase or decrease the air flow through fan assembly 110, the processing circuitry of electronic device 100 can execute one or more programs, and provide a signal to increase the speed of fan assembly 110 and reduce the speed of the signal to turn off fan assembly 110. As an example, input information provided to the processing circuitry may include one or more temperature sensors (not shown in FIG. 2) that determine(s) the temperature of the components within the internal volume of enclosure 102. As a result, when a threshold temperature is reached or exceeded, the processing circuitry can provide the signal to increase the speed of fan assembly 110. Alternatively, or in combination, the input information provided to the processing circuitry may include an amount of time heat-generating component 112 is in use at this elevated speed. For example, after 10 minutes of operation of heat-generating component 112, the processing circuitry can provide the signal to increase the speed of fan assembly 110. The time is intended to be exemplary only, and a different time (or times) may be used.

Figure 3:
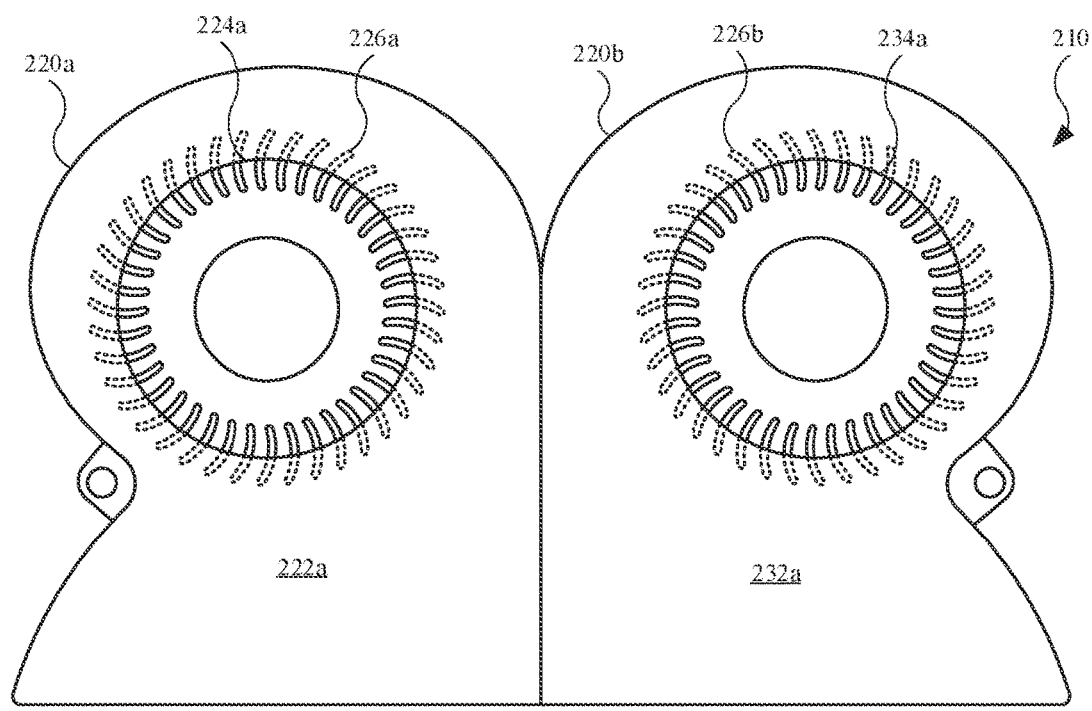
FIG. 3 illustrates a top view of a fan assembly, in accordance with some described embodiments.

FIG. 3 illustrates a top view of a fan assembly 210, in accordance with some described embodiments. Fan assembly 210 can be integrated into electronic devices shown and described herein. As shown, fan assembly 210 includes a system of two fan assemblies, i.e., a fan assembly 220a and a fan assembly 220b. However, the number of fan assembly units of fan assembly 210 may vary. Fan assembly 220a may include a fan housing part 222a that defines an opening 224a. Fan assembly 220a may further include an impeller 226a with multiple impeller blades (shown, not labeled). When rotationally driven by a motor (not shown in FIG. 3), impeller 226a drives air flow into opening 224a. In this regard, opening 224a may be referred to as a fan inlet. Similarly, fan assembly 220b may include a fan housing part 232a that defines an opening 234a used as a fan inlet, as well an impeller 226b with multiple impeller blades (shown, not labeled). When rotationally driven by a motor (not shown in FIG. 3), impeller 226b drives air flow into opening 224b.

Figure 4:
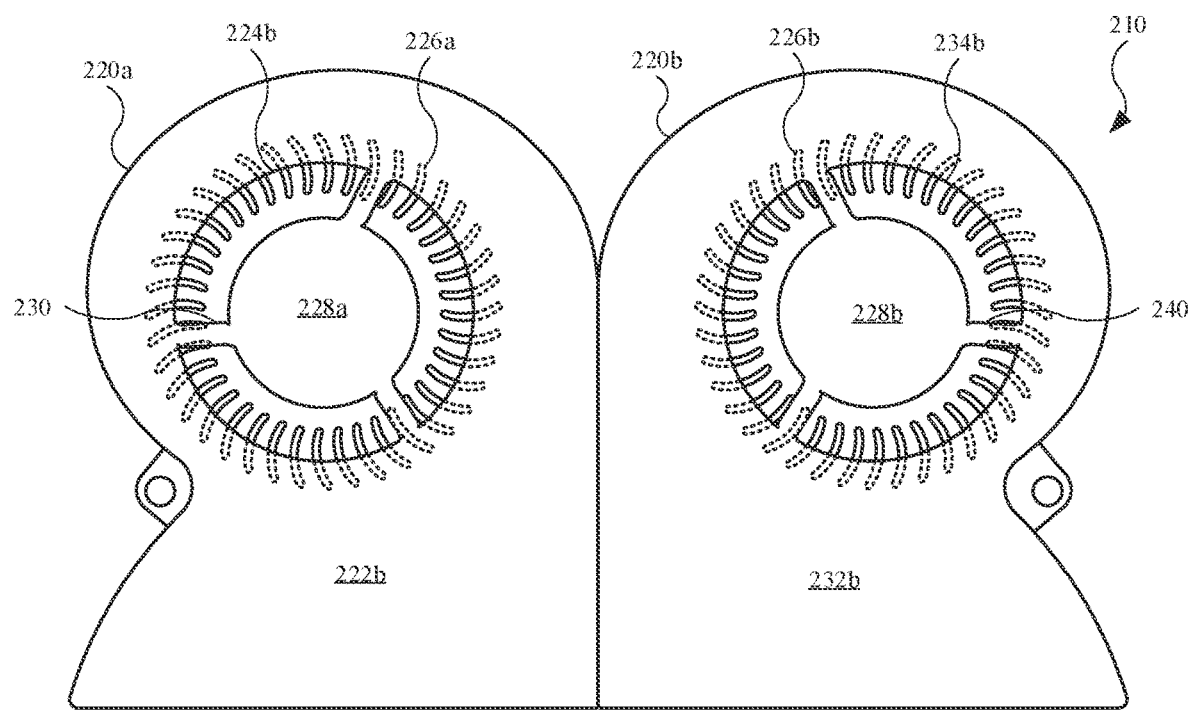
FIG. 4 illustrates a bottom view of the fan assembly shown in FIG. 3, showing additional features.

FIG. 4 illustrates a bottom view of fan assembly 210 shown in FIG. 3, showing additional features. As shown, fan assembly 220a may include a fan housing part 222b that couples with fan housing part 222a (shown in FIG. 3). Fan housing part 222b defines an opening 224b used by fan assembly 220a as an additional fan inlet. Accordingly, when rotationally driven, impeller 226a drives air flow into opening 224b. Similarly, fan assembly 220b may include a fan housing part 232b that couples with fan housing part 232a (shown in FIG. 3). Fan housing part 232b defines an opening 234b used by fan assembly 220b as an additional fan inlet. Accordingly, when rotationally driven, impeller 226b drives air flow into opening 234b.

Fan assemblies 220a and 220b may further include a platform 228a and a platform 228b, respectively. Platforms 228a and 228b are each designed to hold and support a motor (not shown in FIG. 4) of fan assemblies 220a and 220b, respectively. Platforms 228a and 228b are connected to fan housing parts 222b and 232b, respectively, by several struts. For example, fan assembly 220a includes a strut 230 (representative of additional struts) that connects fan housing part 222b to platform 228a, and fan assembly 220b includes a strut 240 (representative of additional struts) that connects fan housing part 232b to platform 228b.

Referring to fan assembly 220a in FIGS. 3 and 4, openings 224a, 224b, 234a, and 234b are generally circular with the same diameter. However, in some embodiments (not shown in FIGS. 3 and 4), openings 224a and 234a include a diameter different (e.g., greater than or less than) openings 224b and 234b, respectively. Furthermore, openings 224a, 224b, 234a, and 234b may include a shape other than a circular shape, such as multi-sided polygonal shape including a rectangle or a hexagon (as non-limiting examples), or an oblong shape. Also, due in part to platform 228a and strut 230, the amount of air flow entering fan assembly 220a during operation (i.e., during rotational movement) of impeller 226a may be greater through opening 224a as compared to opening 224b. Due to the similar features of fan assembly 220b, the amount of air flow entering fan assembly 220b during operation of impeller 226b may be greater through opening 234a as compared to opening 234b. This will be further discussed below.

Figure 5:
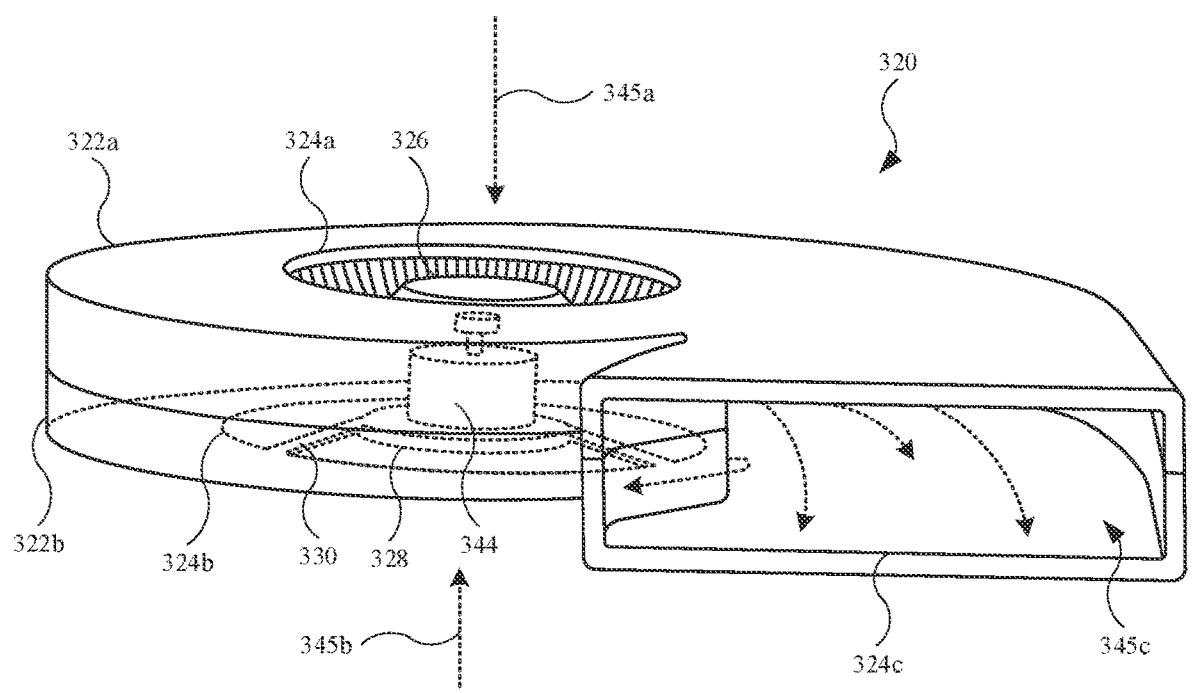
FIG. 5 illustrates an isometric view of a fan assembly, showing an exemplary movement of air flow through the fan assembly, in accordance with some described embodiments.

FIG. 5 illustrates an alternate isometric view of a fan assembly 320, showing an exemplary movement of air flow through fan assembly 320, in accordance with some described embodiments. The features shown and described for fan assembly 320 may be present in other fan assemblies shown and described herein. Fan assembly 320 may include an impeller 326 and a motor 344 used to rotationally drive impeller 326. Fan assembly 320 further includes a fan housing defined by a fan housing part 322a and a fan housing part 322b, with fan housing parts 322a and 322b having an opening 324a and an opening 324b, respectively, that define fan inlets for fan assembly 320. Also, fan housing parts 322a and 322b include an opening 324c used by fan assembly 320 as a fan outlet, fan duct outlet. In order to support and carry motor 344, the fan housing part 322b includes a platform 328 supported by several struts. A strut 330, representing additional struts, is shown.

During operation, impeller 326 is rotationally driven by motor 344, causing air flow (represented by arrows 345a and 345b) to enter fan assembly 320 through openings 324a and 324b. Subsequently, the air flow (represented by an arrow 345c directed to several dotted line arrows) exits fan assembly 320 via opening 324c. Based upon platform 328 and the struts being closer to opening 324b than the opening 324a, opening 324b represents an impeded or partially obstructed opening. Consequently, the air flow through the opening 324b is restricted as compared to the air flow into opening 324a, resulting in less air flow through opening 324b as compared to opening 324a. Due to the uneven air flow through openings 324a and 324b, a non-uniform air flow velocity distribution can develop at impeller 326, causing unwanted flow separation from impeller 326. In some instances, the air flow separation further contributes to turbulence within fan assembly 320, and cause issues such as recirculation. Additionally, the flow separation may also cause unwanted noise to emanate from fan assembly 320. Fortunately, impeller 326 may include design modifications to promote uniform air flow distribution and mitigate or prevent flow separation. These modifications will be shown and described below.

Figure 6:
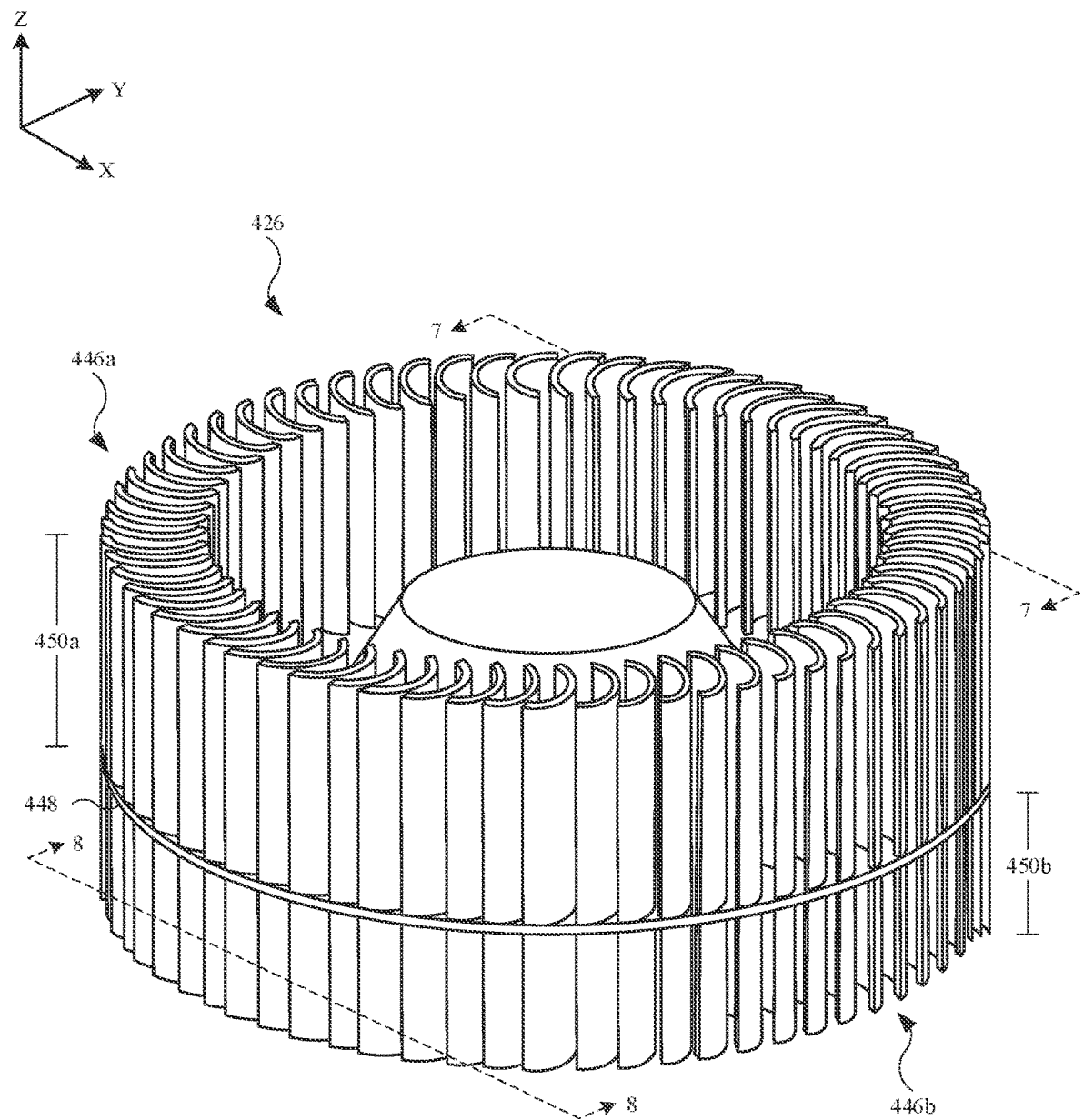
FIG. 6 illustrates an isometric view of an embodiment of an impeller, in accordance with some described embodiments.

FIG. 6 illustrates an isometric view of an embodiment of an impeller 426, in accordance with some described embodiments. The features shown and described for impeller 426 may be present in any impeller shown and described herein. Impeller 426 may include one or more modifications designed to limit or prevent several aforementioned issues. In this regard, impeller 426 includes a first set of impeller blades 446a and a second set of impeller blades 446b, as well as a separating structure 448 that defines a partition, separation, or discontinuity between first set of impeller blades 446a and second set of impeller blades 446b. Separating structure 448 includes at least two surfaces, with first set of impeller blades 446a disposed on one surface and second set of impeller blades 446b disposed on another, opposing surface. As shown, separating structure 448 defines a disc. However, other shapes are possible for separating structure 448.

Although impeller 426 represents a single-piece body, first set of impeller blades 446a and second set of impeller blades 446b may include one or more different geometric properties from each other. For example, each blade of first set of impeller blades 446a may be positioned on separating structure 448 in accordance with a first geometry, while each blade of second set of impeller blades 446b may be positioned on separating structure 448 in accordance with a second, different geometry. The different geometry (or geometries) may refer to different angular positions with respect to a reference, such as a Z-axis. Furthermore, the geometry of blades may refer to an angle of a leading edge of each blade and/or a trailing edge of each blade. This will be further shown and described below. As a result, impeller 426 may be referred to as an asymmetric impeller, as two sections (i.e., first set of impeller blades 446a and second set of impeller blades 446b), partitioned by a plane (through the X-Y axis) passing through separating structure 448, creates a pair of structurally unequal sections.

Alternatively, or in combination, the length (i.e., major dimension) of first set of impeller blades 446a may differ from second set of impeller blades 446b. For example, each blade of first set of impeller blades 446a includes a length 450a, while each blade of second set of impeller blades 446b includes a length 450b. As shown, length 450a is greater than length 450b. However, in some embodiments (not shown), length 450b is greater than length 450a. Lengths 450a and 450b are defined by the position of separating structure 448 along the Z-axis, and separating structure 448 can be positioned in different location (for example, along the Z-axis) or according to a desired length for first set of impeller blades 446a and second set of impeller blades 446b. For example, when a design specification of fan assembly (not shown in FIG. 6) requires a particular fan inlet to intake more air than another fan inlet, the set of impeller blades have a greater length may be aligned with, and positioned closer to, the fan inlet require additional air flow. Accordingly, in some embodiments, blades of greater length are capable of driving more air flow.

Also, in some embodiments, impeller 426 is formed by a molding operation, including an injection molding operation as a non-limiting example. The design of the mold cavity, or cavities, and mold core(s) used for the molding operation control the position of separating structure 448, and accordingly, lengths 450a and 450b. Also, as shown, separating structure 448 includes an outer diameter that extends to the ends of the blades of first set of impeller blades 446a and second set of impeller blades 446b. This allows the molding operation that forms impeller 426 to form first set of impeller blades 446a in a manner different from second set of impeller blades 446b. Additionally, impellers formed by an injection molding operation generally require the vertical surfaces (of the impeller blades) to be drafted at a slight angle relative to the axis of mold separation to promote ejection of the part (e.g., impeller) from the tool. In prior molding operations for traditional impellers, the draft angle is applied over the full height of the impeller blades with symmetric geometry. This draft angle results in tapering, causing the impeller blade thickness over the height (end-to-end) of the impeller blade, which can result in sub-optimal blade thickness in portions of the overall blade height. One advantage of impellers described herein (e.g., impeller 426) is the reduction in the total height of the draft angle. For example, a draft angle imposed on an impeller blade of first set of impeller blades 446a or an impeller blade of second set of impeller blades 446b is reduced by approximately half, as the respective impeller blades of first set of impeller blades 446a and second set of impeller blades 446b are separate from each other. This results in a significant reduction in the adverse effects of draft on impeller blade thickness, thereby allowing the resulting parts to conform much closer to the ideal thickness, or specified thickness, of the impeller blade design. Another advantage is related the parting line formed between the two halves of the molding tool, which traditionally results in a very small step, or extension, running along the critical surfaces of the impeller blades. This step results from the draft angles associated with each half of the molding tool being tilted in opposite directions since the mold halves part in opposite directions (to promote part ejection from the tool cavities). This resulting step in the surface is disruptive to air flow passing over impeller blade and can result in air flow separation, which adversely affects air flow and noise of the impeller. By separating the upper and lower blade regions (e.g., first set of impeller blades 446a and second set of impeller blades 446b, respectively) such that no parting line on the impeller blade faces is required, the impeller blade surfaces are free of undesirable step changes in thickness that are adverse for impeller blade performance.

Figure 7:
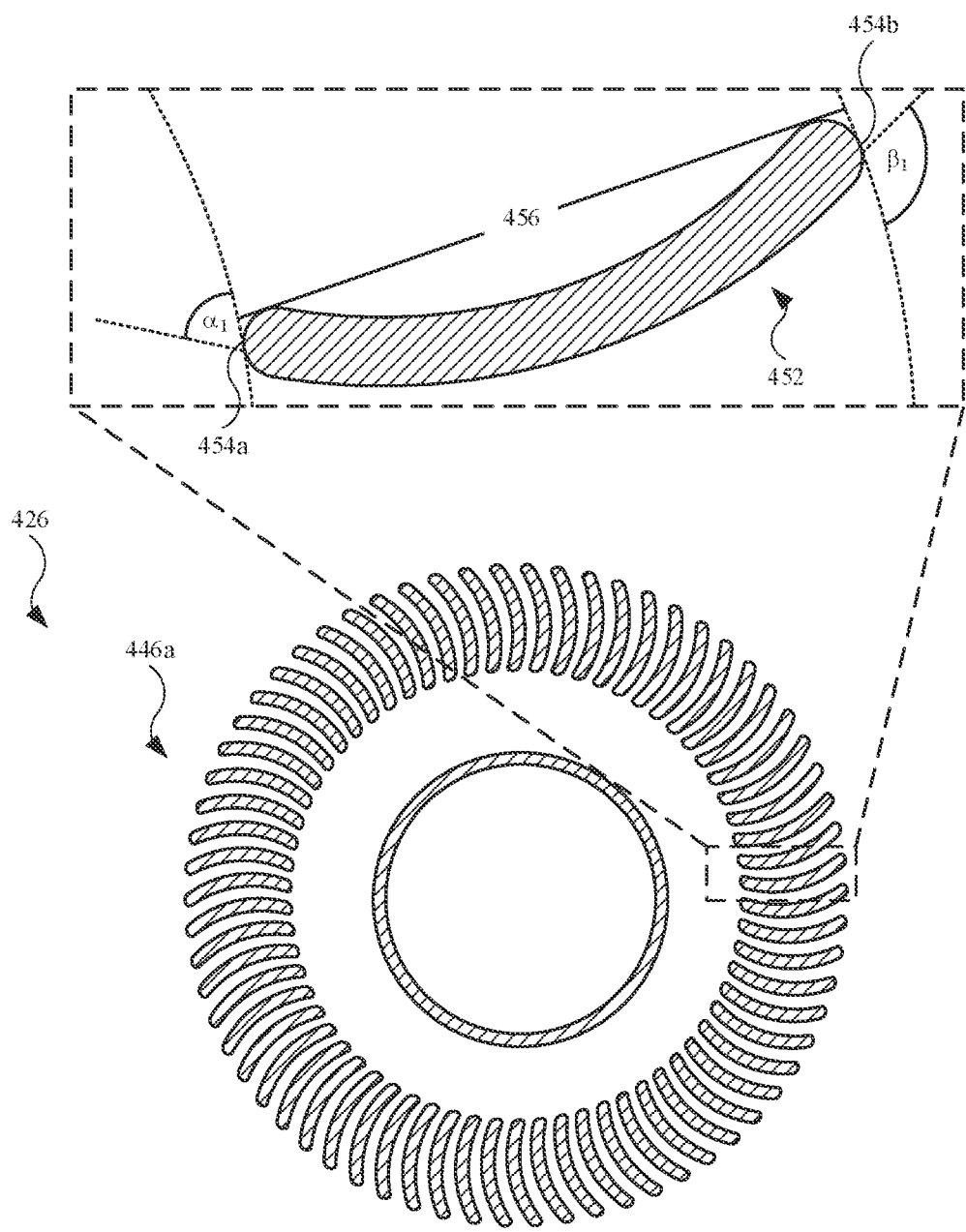
FIG. 7 illustrates a cross sectional view of the impeller shown in FIG. 6, taken along line 7-7, showing the first set of impeller blades.

FIG. 7 illustrates a cross sectional view of impeller 426 shown in FIG. 6, taken along line 7-7, showing first set of impeller blades 446a. As shown in the enlarged view, first set of impeller blades 446a includes an impeller blade 452 (representative of the remaining impeller blades). Several characteristics for impeller blade 452 are shown. For example, impeller blade 452 includes a leading edge 454a and a trailing edge 454b. As shown, leading edge 454a and trailing edge 454b are defined by an angle $\alpha_1$ and $\beta_1$, respectively, with each of angles $\alpha_1$ and $\beta_1$ measured with respect to a reference line or surface. Additionally, impeller blade 452 includes a chord length 456 that defines a diameter of impeller blade 452.

Figure 8:
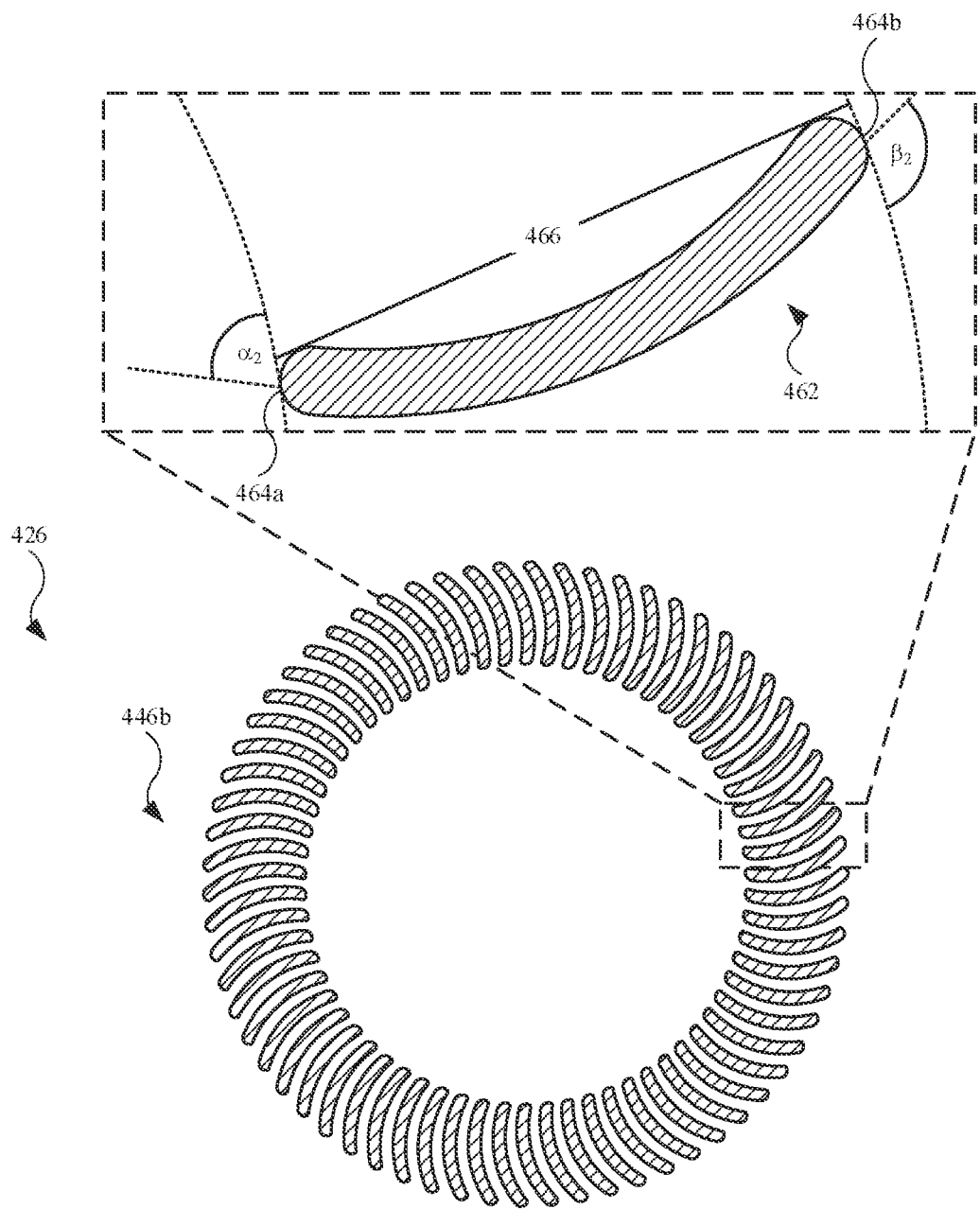
FIG. 8 illustrates a cross sectional view of the impeller shown in FIG. 6, taken along line 8-8, showing the second set of impeller blades.

Conversely, FIG. 8 illustrates a cross sectional view of impeller 426 shown in FIG. 6, taken along line 8-8, showing second set of impeller blades 446b. As shown in the enlarged view, second set of impeller blades 446b includes an impeller blade 462 (representative of the remaining impeller blades). Several characteristics for impeller blade 462 are shown. For example, impeller blade 462 includes a leading edge 464a and a trailing edge 464b. As shown, leading edge 464a and trailing edge 464b are defined by an angle $\alpha_2$ and $\beta_2$, respectively, with each of angles $\alpha_2$ and $\beta_2$ measured with respect to a reference line or surface. Additionally, impeller blade 462 includes a chord length 466 that defines a diameter of impeller blade 462.

Impeller blades 452 and 462, shown in FIGS. 7 and 8, respectively, may differ in design by any one or more characteristics. For example, angle $\alpha_1$ of leading edge 454a of impeller blade 452 may be different than angle $\alpha_2$ of leading edge 464a of impeller blade 462, and accordingly, impeller blades 452 and 462 may be oriented differently and may include a different geometric shape. Alternatively, or in combination, angle $\beta_1$ of trailing edge 454b of impeller blade 452 may be different than angle $\beta_2$ of trailing edge 464b of impeller blade 462, and accordingly, impeller blades 452 and 462 may be further oriented differently and may further include a different geometric shape. Alternatively, or in combination, chord length 456 of impeller blade 452 may be different than chord length 466 of impeller blade 462, and accordingly, impeller blades 452 and 462 may further include a different geometric shape.

Although not specifically shown in FIGS. 6-8, several additional geometric characteristics may differ between first set of impeller blades 446a and second set of impeller blades 446b. For example, the differences between the respective impeller blades of first set of impeller blades 446a and second set of impeller blades 446b may include differences in number of blades, as a non-limiting example. Regarding the number of impeller blades, in some embodiments, first set of impeller blades 446a includes N impeller blades, while second set of impeller blades 446b includes an integer greater than N or an integer less than N. Alternatively, the difference between the number of blades of the respective sets of impeller blades may be a multiple of a, such as a×N, where a can be greater than 1 or less than 1 so long as a×N is an integer. Still further, first set of impeller blades 446a and second set of impeller blades 446b may include different lengthwise orientations. For example, referring to FIG. 6, first set of impeller blades 446a and second set of impeller blades 446b, are perpendicular, or at least substantially perpendicular, with respect to separating structure 448. However, first set of impeller blades 446a and/or second set of impeller blades 446b may be slanted, or diagonal, with some non-zero angle measured with respect to the Z-axis. Further, when both sets of impeller blades are slanted, their respective non-zero angles may be different. Still further, even with identical set of geometric parameters (e.g., number of blades, leading/trailing edge angles and chord lengths), the angular positions of the blades in the first set of impeller blades 446a and second set of impeller blades 446b may be different, either by application of a constant angular offset to one set of blades, or by applying variable blade spacing to the two sets in different manners.

The respective design differences between first set of impeller blades 446a and second set of impeller blades 446b are intended to optimize a fan assembly (not shown in FIG. 6) that integrates impeller 426. For example, when impeller 426 is substituted for impeller 326 (shown in FIG. 5) and integrated with fan assembly 320, first set of impeller blades 446a is aligned with opening 324a and second set of impeller blades 446b is aligned with opening 324b. Due to the design differences between first set of impeller blades 446a and second set of impeller blades 446b, impeller 426 is optimized to promote uniform velocity distribution between air flow exiting first set of impeller blades 446a and second set of impeller blades 446b. Accordingly, impeller 426 can mitigate or prevent unwanted flow separation, leading to improved efficiency (i.e., less recirculation) and noise reduction.

Figure 9:
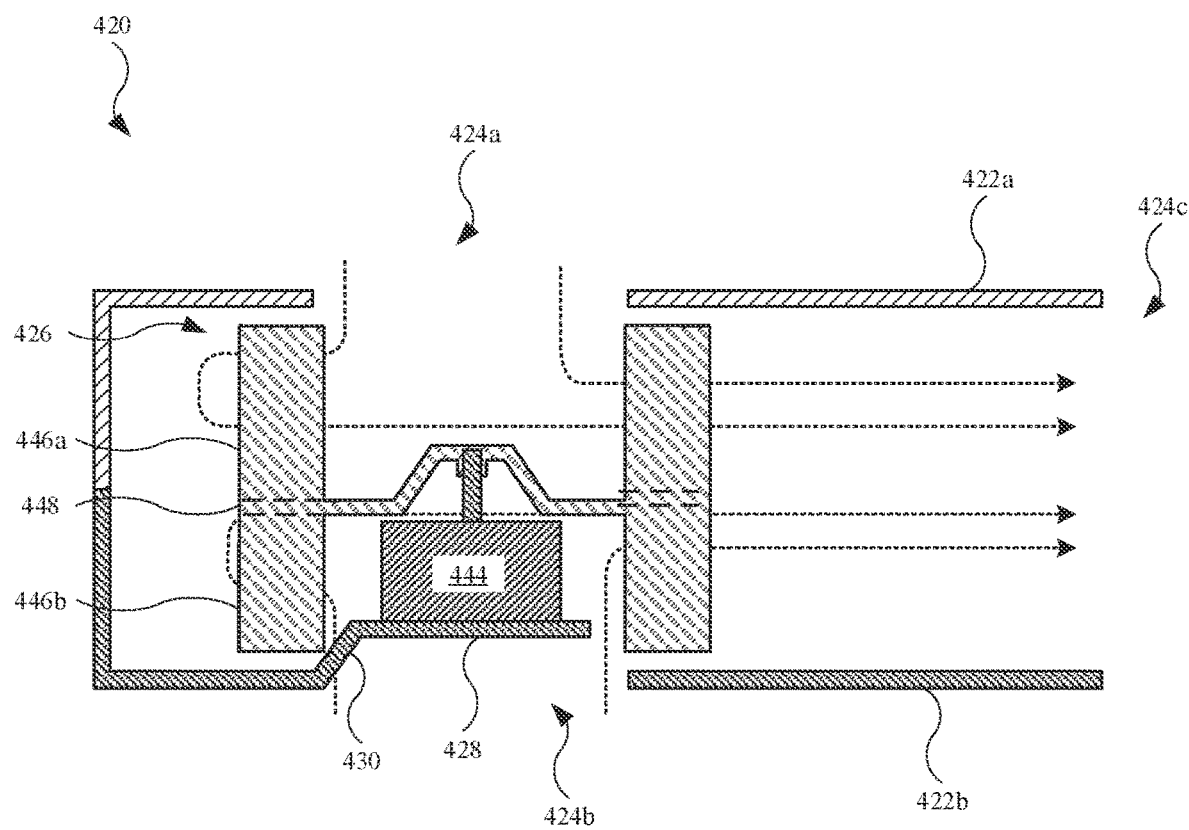
FIG. 9 illustrates a cross sectional view of a fan assembly, showing air flow passing through the fan assembly using the impeller, in accordance with some described embodiments.

FIG. 9 illustrates a cross sectional view of a fan assembly 420, showing air flow passing through fan assembly 420 using impeller 426 (shown in FIGS. 6-8), in accordance with some described embodiments. Fan assembly 420 may include features for other fan assemblies shown and described herein. For example, fan assembly 420 includes a fan housing part 422a and a fan housing part 422b that define an opening 424a an opening 424b, respectively, with openings 424a and 424b used as fan inlets. Fan housing parts 422a and 422b further define an opening 424c used as a fan outlet. Also, impeller 426 is coupled with a motor 444, with motor 444 disposed on a platform 428 that is connected to fan housing part 422b by strut 430. Although not shown, additional struts may be used to connect fan housing part 422b with platform 428.

When integrated into fan assembly 420, first set of impeller blades 446a and second set of impeller blades 446b are aligned with openings 424a and 424b, respectively. Several arrows with dotted lines generally represent air flow passing through openings 424a and 424b when impeller 426 is rotationally driven. The air flow path, represented by the dotted lines, is exemplary only, and provides an approximate direction of air flow through fan assembly 420. As shown, opening 424a is generally unimpeded or unobstructed by features of fan assembly 420, while several features—platform 428, strut 430 (representing additional struts), and motor 444—provide at least some impedance or obstruction for air flow passing through opening 424b. As a result, the amount of air flow reaching first set of impeller blades 446a through opening 424a may be greater than that reaching second set of impeller blades 446b through opening 424b. However, due in part to the independent design modifications of first set of impeller blades 446a and second set of impeller blades 446b, impeller 426 is optimized to handle the disparate air flow, as first set of impeller blades 446a and second set of impeller blades 446b account for differences in air flow conditions. As a result, impeller 426 can provide more uniform velocity distribution, leading to less unwanted air flow separation and resultant noise. Additionally, separating structure 448, which extends to the respective impeller blade edges of first set of impeller blades 446a and second set of impeller blades 446b, acts as an additional barrier that mitigates or prevents air flow through opening 424b from mixing with air flow through opening 424a, or vice versa, which may assist in preventing unwanted non-uniform air flow velocity.

Figure 10:
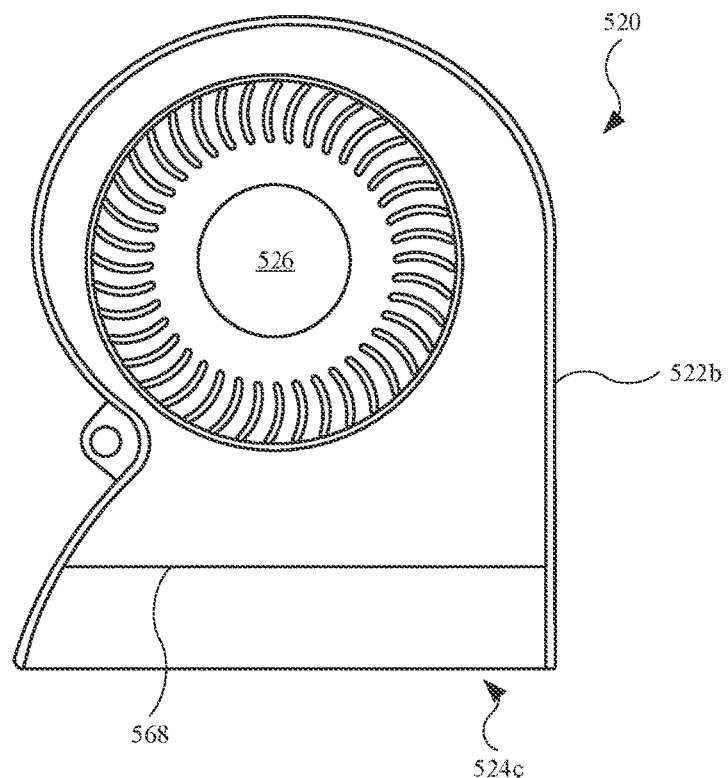
FIG. 10 illustrates a plan view of an alternate embodiment of a fan assembly with an integrated feature used to promote steady air flow.

FIG. 10 illustrates a plan view of an alternate embodiment of a fan assembly 520 with an integrated feature used to promote steady air flow. For purposes of illustration, a fan housing part is removed from fan assembly 520. As shown, fan assembly 520 includes a fan housing part 522b and an impeller 526 that may include any features shown and described herein for an impeller. Further, fan assembly 520 includes an air flow separator 568 that acts as a barrier between air flow leaving different sets of impeller blades (not shown in FIG. 10) of impeller 526. Air flow separator 568 can surround impeller 526 and extend in a direction toward an opening 524c (or fan outlet) of fan assembly 520.

Figure 11:
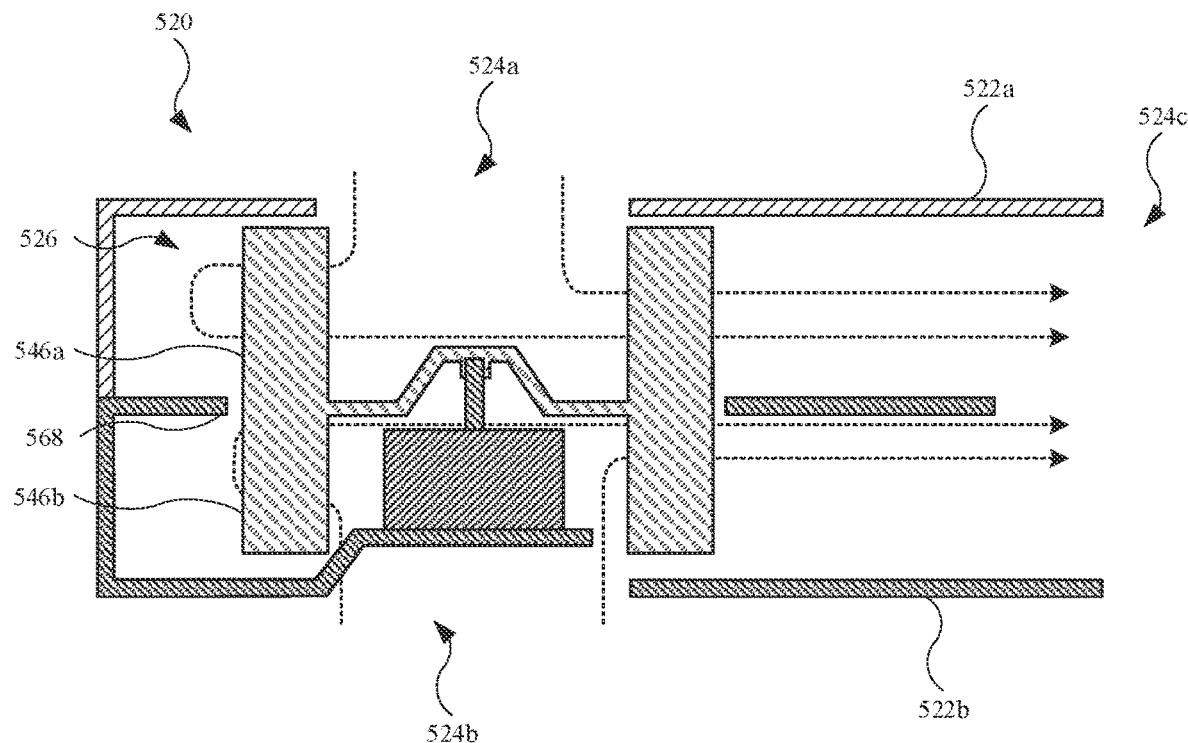
FIG. 11 illustrates a cross sectional view of the fan assembly shown in FIG. 10, showing air flow passing through the fan assembly based in part on the impeller and the air flow separator, in accordance with some described embodiments.

FIG. 11 illustrates a cross sectional view of fan assembly 520 shown in FIG. 10, showing air flow passing through fan assembly 520 based in part on impeller 526 and air flow separator 568, in accordance with some described embodiments. Fan assembly 520 may include any features shown and described herein, including features for impeller 526. As shown, air flow separator 568 is integrally formed with fan housing part 522b. Alternatively, air flow separator 568 can be integrally formed with fan housing part 522a. During operation, impeller 526 drives air flow into openings 524a and 524b of fan assembly. However, as the air flow leaves impeller 526, air flow separator 568 is positioned to prevent air flow exiting a first set of impeller blades 546a (of impeller 526) from interacting or intermingling with air flow exiting a second set of impeller blades 546b (of impeller 526). As a result, air flow separator 568 can further mitigate or prevent issues related to velocity gradients and/or transient flow structures in the air flow from first set of impeller blades 546a and air flow from second set of impeller blades 546b, and any interaction of the respective air flows may occur further downstream from impeller 526 where air flow separator 568 terminates. This could allow velocity differences and transient flow structures downstream of first set of impeller blades 546a and second set of impeller blades 546b to dissipate before re-uniting these two air flows.

Figure 12:
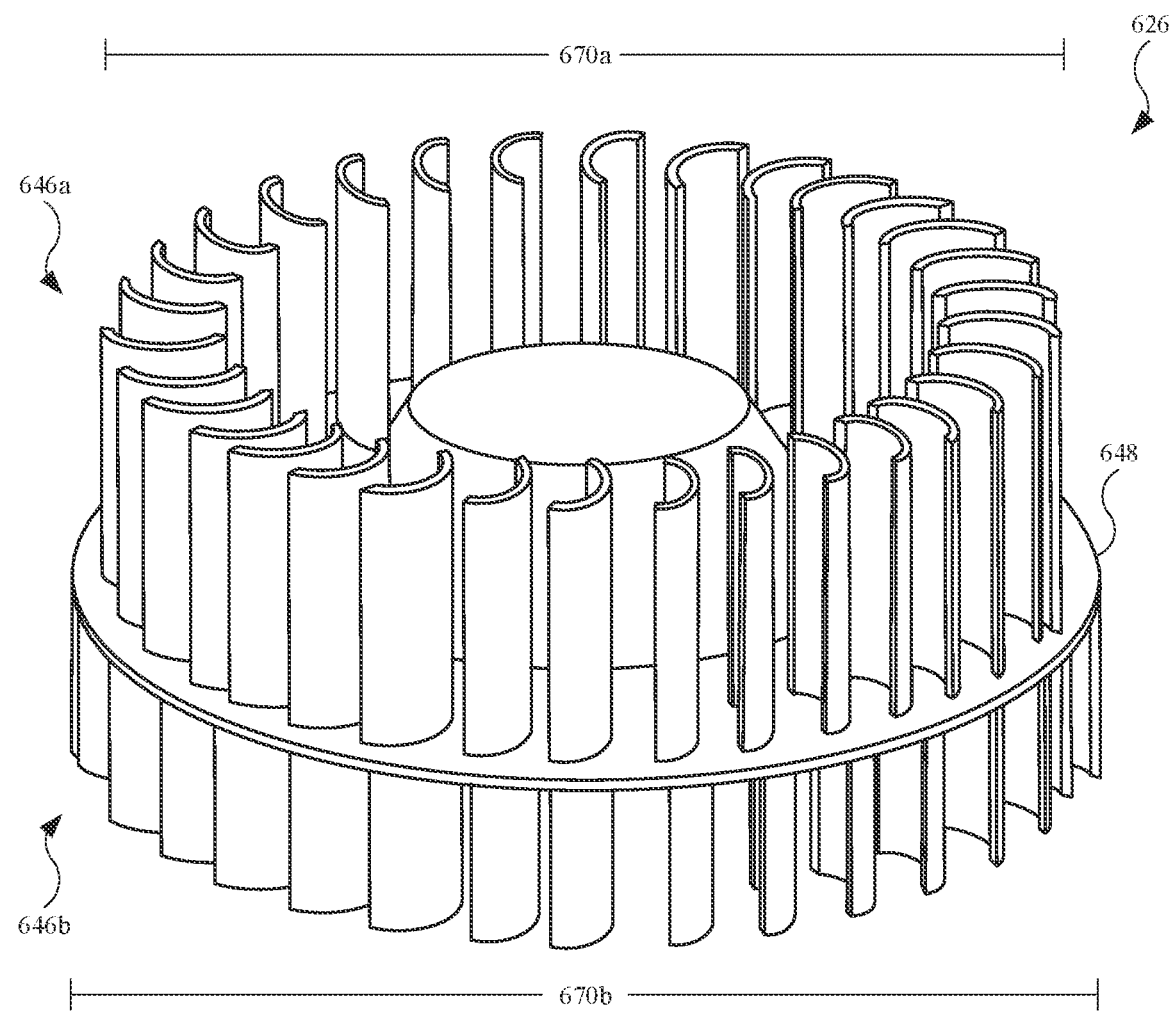
FIG. 12 illustrates an isometric view of an alternate embodiment of an impeller, showing an additional relationship between two sets of impeller blades.

FIG. 12 illustrates an isometric view of an alternate embodiment of an impeller 626, showing an additional relationship between two sets of impeller blades. As shown, impeller 626 includes a first set of impeller blades 646a and a second set of impeller blades 646b, with first set of impeller blades 646a and a second set of impeller blades 646b coupled to, and separated by, a separating structure 648. Although not explicitly shown, impeller 626 may incorporate any differences between first set of impeller blades 646a and second set of impeller blades 646b shown and described herein for impellers, such as the differences shown and described for first set of impeller blades 446a and second set of impeller blades 446b in FIGS. 7 and 8, respectively. Also, first set of impeller blades 646a and second set of impeller blades 646b are defined (collectively) by a diameter 670a and 670b, respectively. Diameters 670a and 670b may also be referred to as an outer diameter or blade outlet diameter, of first set of impeller blades 646a and second set of impeller blades 646b, respectively. While prior embodiments of impellers generally show respective diameters of two sets of impellers blades being equal, diameters 670a and 670b are different from each other. For example, diameter 670a includes a length, or quantitative dimension, that is less than that of diameter 670b. Moreover, each blade of second set of impeller blades 646b includes an edge that extends to an edge (i.e., an outer edge) of separating structure 648, and accordingly, separating structure 648 may include a diameter defined by diameter 670b. However, each blade of first set of impeller blades 646a includes an edge that does not extend to an edge of separating structure 648. This difference, or independence, between first set of impeller blades 646a and second set of impeller blades 646b can tailor impeller 626 to meet different requirement for the air flow through two different fan inlets of a fan assembly (i.e., openings 324a and 324b of fan assembly 320 shown in FIG. 5). It should be noted also that, while not shown, impeller 626 may additionally include any modifications shown and described herein for an impeller.

Figure 13:
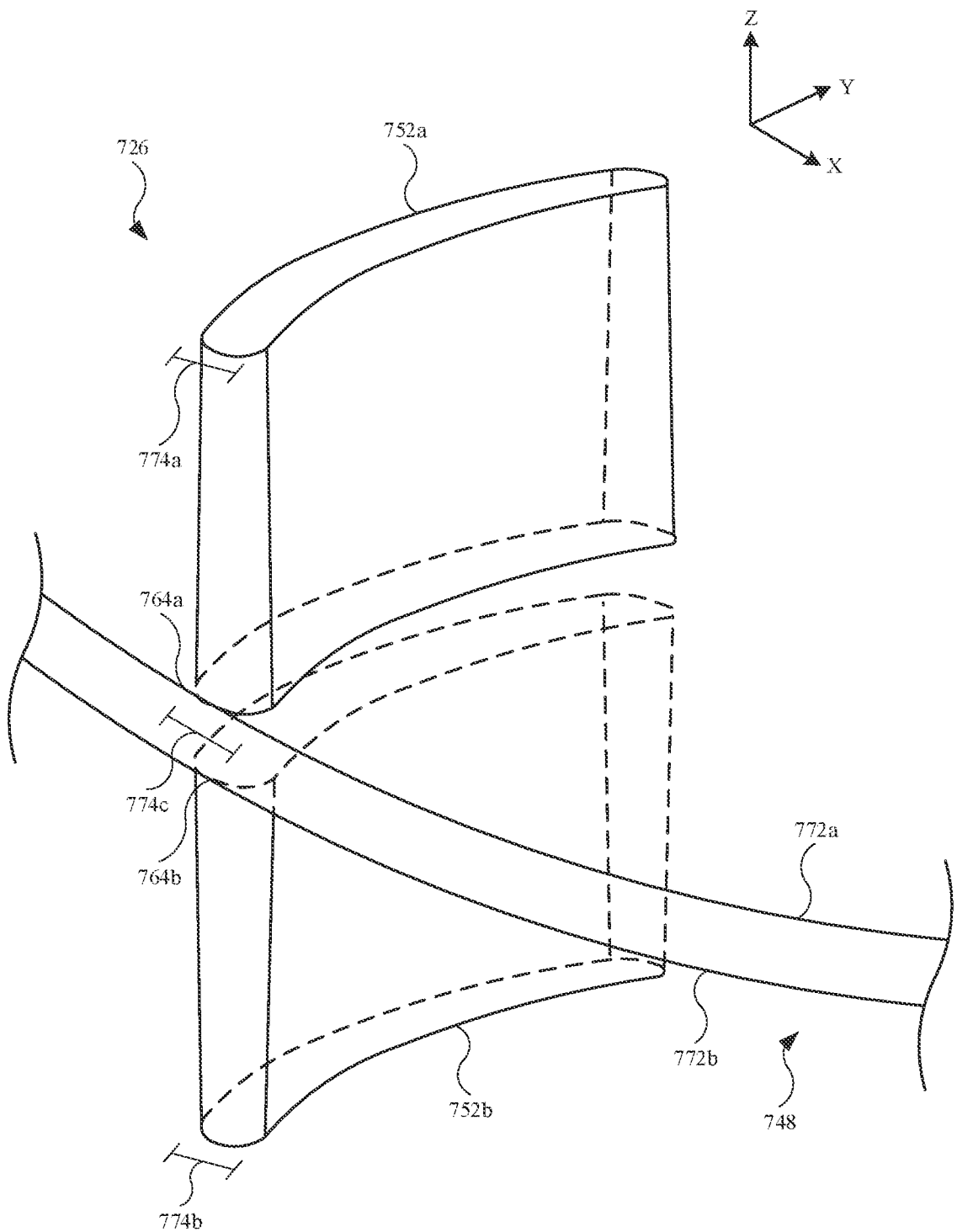
FIG. 13 illustrates an enlarged view of an embodiment of an impeller, showing additional features of manufacturing methods of impellers described herein.

FIG. 13 illustrates an enlarged view of an embodiment of an impeller 726, showing additional features of manufacturing methods of impellers described herein. As shown, impeller 726 includes an impeller blade 752a (representative of additional impeller blades of a first set of impeller blades, not shown) and an impeller blade 752b (representative of additional impeller blades of a second set of impeller blades, not shown). Impeller 726 further includes a separating structure 748 (i.e., a disc) that separates impeller blades 752a and 752b.

Impellers formed through molding operations, including an injection molding operation, require certain modifications. For example, when developing polymer-based injection molded impellers, a draft (or taper) to external features (e.g., impeller blades 752a and 752b) may enhance the overall ability to successfully mold the impeller. Traditional molded impellers, which include symmetric a blade geometry (i.e., first and second or top and bottom, respectively, sets of impellers blades with the same blade geometry) require additional considerations with respect to draft angle in order to mitigate molding issues, such as a parting line formed on an impeller blade (or blades).

However, for several impellers described herein, the separating structure extends laterally to the edges of both sets of impeller blades, and accordingly, the edge(s) of the separating structure is flush, or co-planar, with respect to edges of the first and second sets of impeller blades. For example, separating structure 748 includes an edge 772a that extends to an edge 764a of impeller blade 752a, as well as an edge 772b that extends to an edge 764b of impeller blade 752b. As a result, the respective draft angles required to mold impeller blades 752a and 752b, resulting in less tapering of impeller blades 752a and 752b. For example, impeller blades 752a and 752b include a thickness 774a and 774b, respectively, with thicknesses 774a and 774b representing an impeller dimension at a location of impeller blades 752a and 752b, respectively, across a surface (across an X-Y plane) furthest away (along the Z-axis) from separating structure 748. In some embodiments, thicknesses 774a and 774b are the same, or at least substantially similar. Also, impeller blades 752a and 752b may each include a thickness 774c, representing an impeller dimension for each of impeller blades 752a and 752b on respective surfaces of separating structure 748. While thickness 774c may be greater than thickness 774a and 774b, and thus, define a tapering of impeller blades 752a and 752b, the relative tapering is less than that of traditional molded impeller blades, having identical blade geometries that also extends laterally beyond their separating structure. As a result, the design and shape of impeller blades 752a and 752b more closely resembles a specified impeller blade design, as compared to traditional impeller blades.

Figure 14:
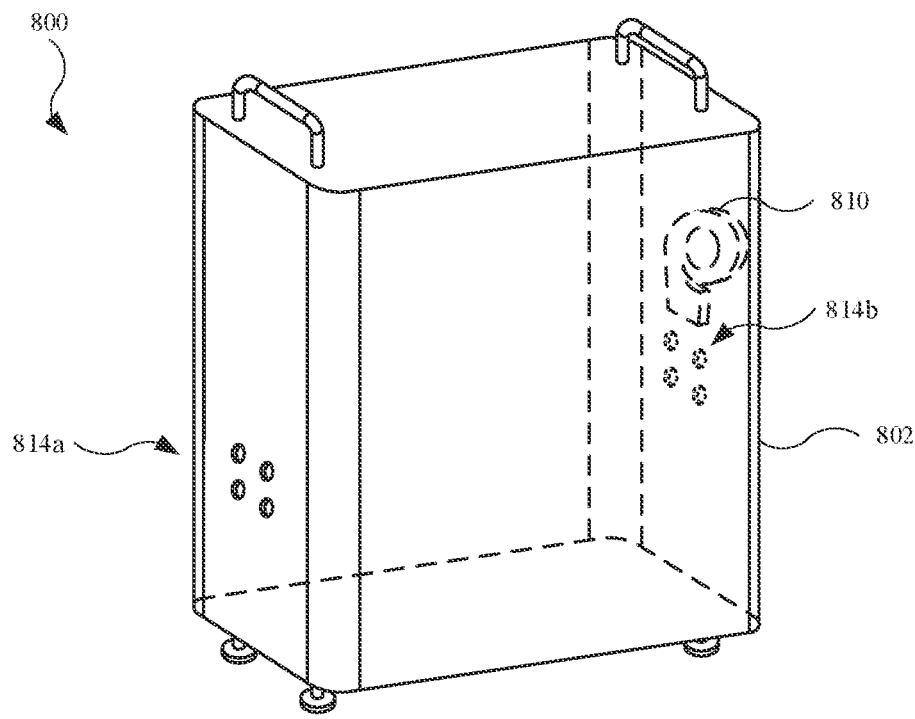
FIG. 14 illustrates an alternate embodiment of an electronic device with a fan assembly described herein.
Figure 15:
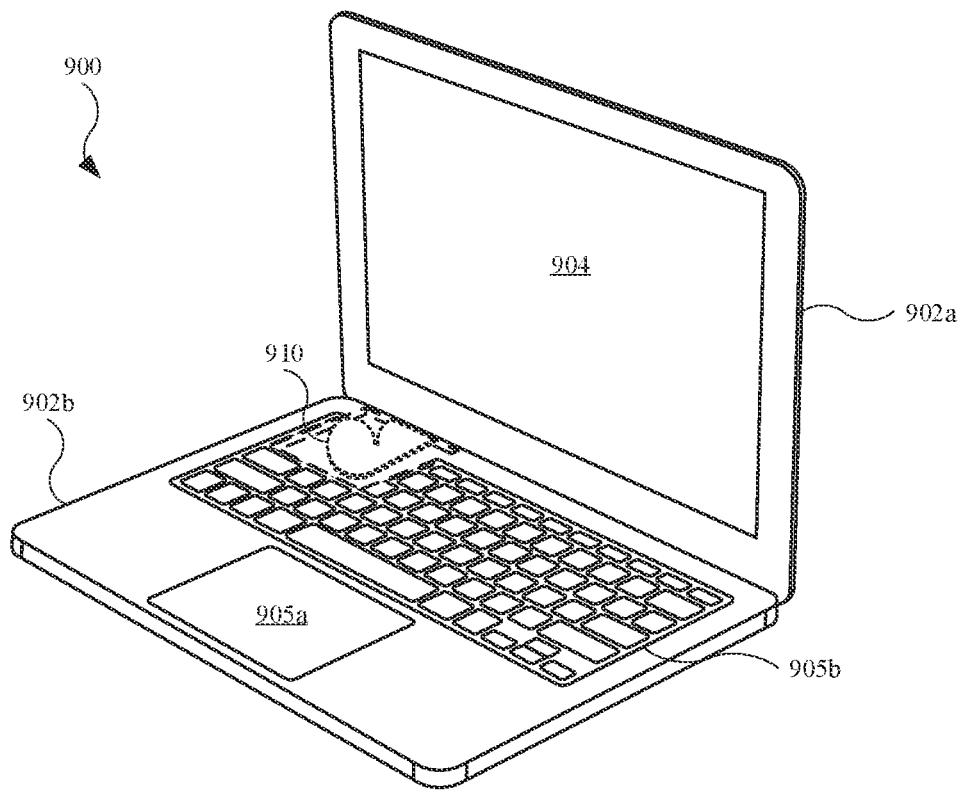
FIG. 15 illustrates an alternate embodiment of an electronic device with a fan assembly described herein.

Fan assemblies described herein may be integrated with different electronic devices. FIGS. 14 and 15 illustrate different electronic devices that can use any of the fan assemblies shown and described herein.

FIG. 14 illustrates an isometric view of an alternate embodiment of an electronic device 800, in accordance with some described embodiments. Electronic device 800 may include a desktop computing device, or "tower," designed for use with a display and other accessories (not shown in FIG. 14), such as a display/monitor, a mouse, and/or a keyboard. As shown, electronic device 800 includes an enclosure 802, or housing, that defines an internal volume that can carry several internal components including, as non-limiting examples, processing circuitry (such as a central processing unit and a graphics processing unit), memory circuits, circuit boards, audio components such as speakers and microphones, a battery, and flexible circuitry that connects together the aforementioned components. Electronic device 800 includes a fan assembly 810 that can draw the heated air away from one or more heat-generating components (not shown in FIG. 14) of electronic device 800. Further, fan assembly 810 can receive ambient air via openings 814a formed in enclosure 802, and subsequently drive the heated air out of enclosure 802 via openings 814b formed in enclosure 802. As a result, fan assembly 810 can reduce the temperature of the components within the internal volume of enclosure 802.

FIG. 15 illustrates an isometric view of an alternate embodiment of an electronic device 900, in accordance with some described embodiments. Electronic device 900 may include a laptop computing device. As shown, electronic device 900 includes a housing part 902a and a housing part 902b, also referred to as display housing and a base portion, respectively. Housing parts 902a and 902b may be rotationally coupled to each other to allow relative movement between the housing parts.

Housing part 902a may carry a display 904, and housing part 902b may carry an input mechanism 905a and an input mechanism 905b. Input mechanisms 905a and 905b may include a touch pad and a keyboard, respectively. Further, housing part 902b may define an internal volume that can carry several internal components including, as non-limiting examples, processing circuitry (such as a central processing unit and a graphics processing unit), memory circuits, circuit boards, audio components such as speakers and microphones, a battery, and flexible circuitry that electrically connects together the aforementioned components. As shown in a partial cross section, electronic device 900 may include a fan assembly 910 located in housing part 902b. Fan assembly 910 can draw the heated air away from one or more heat-generating components (not shown in FIG. 15) of the electronic device 900. Further, the fan assembly 910 can receive ambient air via openings (not shown in FIG. 15) formed in the housing part 902b, and subsequently drive the heated air out of housing part 902b via openings (not shown in FIG. 15) formed in the housing part 902b. As a result, fan assembly 910 can reduce the temperature of the components within the internal volume of housing part 902b.

Figure 16:
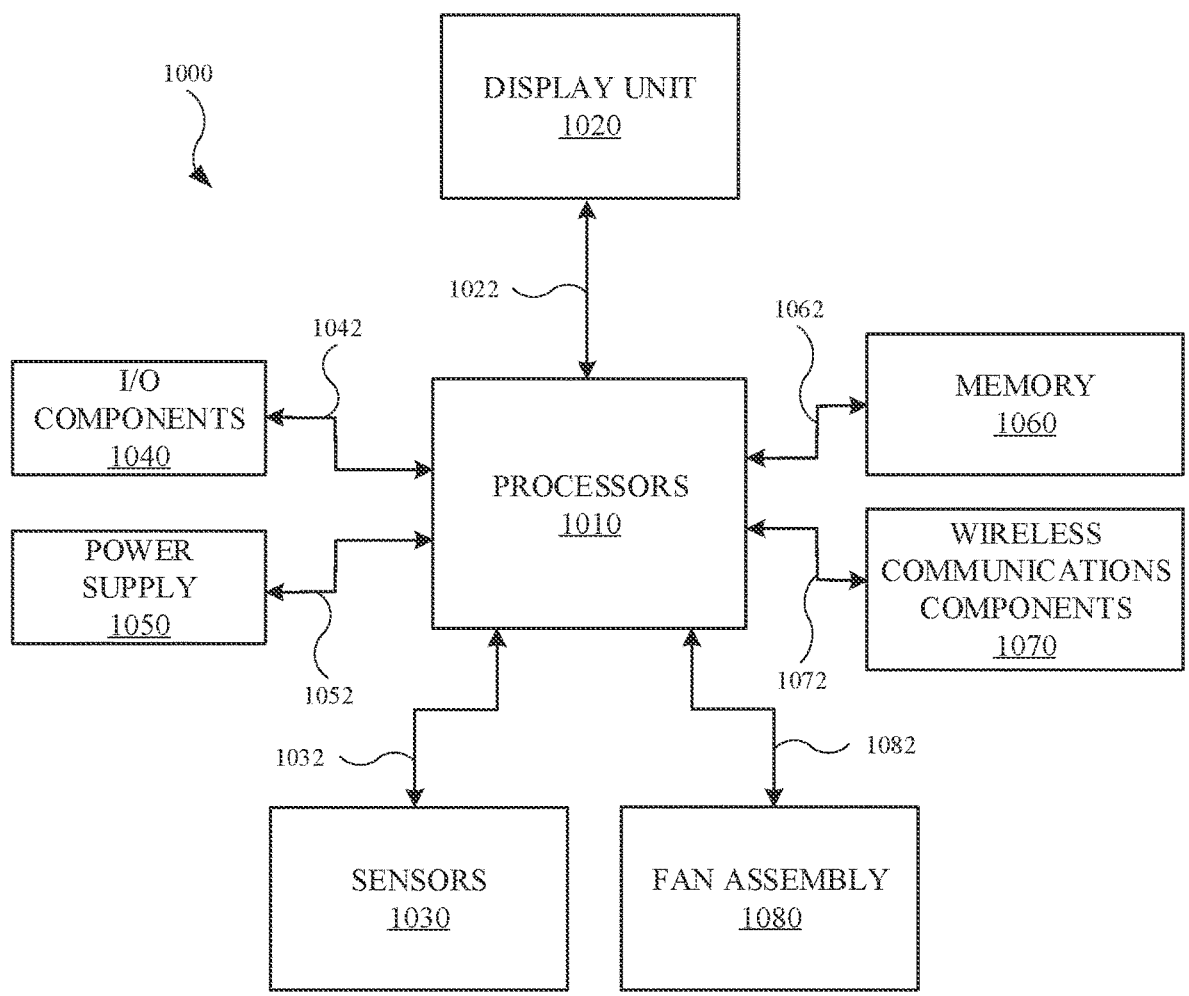
FIG. 16 illustrates a block diagram of an electronic device, in accordance with some described embodiments.

FIG. 16 illustrates a block diagram of an electronic device 1000, in accordance with some described embodiments. The features in the electronic device 1000 may be present in other electronic devices described herein. Electronic device 1000 may include one or more processors 1010 for executing functions of the electronic device 1000. One or more processors 1010 can refer to at least one of a central processing unit (CPU) and at least one microcontroller for performing dedicated functions. Also, one or more processors 1010 can refer to application specific integrated circuits.

According to some embodiments, electronic device 1000 can include a display unit 1020. Display unit 1020 is capable of presenting a user interface that includes icons (representing software applications), textual images, and/or motion images. In some examples, each icon can be associated with a respective function that can be executed by one or more processors 1010. In some cases, display unit 1020 includes a display layer (not illustrated), which can include a liquid-crystal display (LCD), light-emitting diode display (LED), or the like. According to some embodiments, display unit 1020 includes a touch input detection component and/or a force detection component that can be configured to detect changes in an electrical parameter (e.g., electrical capacitance value) when the user's appendage (acting as a capacitor) comes into proximity with display unit 1020 (or in contact with a transparent layer that covers the display unit 1020), Display unit 1020 is connected to the one or more processors 1010 via one or more connection cables 1022.

According to some embodiments, electronic device 1000 can include one or more sensors 1030 capable of providing an input to one or more processors 1010 of the electronic device 1000. One or more sensors 1030 may include a temperature sensor(s), as a non-limiting example. One or more sensors 1030 is/are connected to one or more processors 1010 via one or more connection cables 1032.

According to some embodiments, electronic device 1000 can include one or more input/output components 1040. In some cases, one or more input/output components 1040 can refer to a button or a switch that is capable of actuation by the user. When one or more input/output components 1040 are used, one or more input/output components 1040 can generate an electrical signal that is provided to one or more processors 1010 via one or more connection cables 1042.

According to some embodiments, electronic device 1000 can include a power supply 1050 that is capable of providing energy to the operational components of electronic device 1000. In some examples, power supply 1050 can refer to a rechargeable battery. Power supply 1050 can be connected to one or more processors 1010 via one or more connection cables 1052. Power supply 1050 can be directly connected to other devices of electronic device 1000, such as one or more input/output components 1040. In some examples, electronic device 1000 can receive power from another power sources (e.g., an external charging device) not shown in FIG. 16.

According to some embodiments, electronic device 1000 can include memory 1060, which can include a single disk or multiple disks (e.g., hard drives), and includes a storage management module that manages one or more partitions within memory 1060. In some cases, memory 1060 can include flash memory, semiconductor (solid state) memory or the like. Memory 1060 can also include a Random Access Memory ("RAM") and a Read-Only Memory ("ROM"). The ROM can store programs, utilities or processes to be executed in a non-volatile manner. The RAM can provide volatile data storage, and stores instructions related to the operation of electronic device 1000. In some embodiments, memory 1060 refers to a non-transitory computer readable medium. One or more processors 1010 can also be used to execute software applications. In some embodiments, a data bus 1062 can facilitate data transfer between memory 1060 and one or more processors 1010.

According to some embodiments, electronic device 1000 can include wireless communications components 1070. A network/bus interface 1072 can couple wireless communications components 1070 to one or more processors 1010. Wireless communications components 1070 can communicate with other electronic devices via any number of wireless communication protocols, including at least one of a global network (e.g., the Internet), a wide area network, a local area network, a wireless personal area network (WPAN), or the like. In some examples, wireless communications components 1070 can communicate using NFC protocol, BLUETOOTH® protocol, or WIFI® protocol.

According to some embodiments, electronic device 1000 can include a fan assembly 1080. Fan assembly 1080 is designed to drive air flow and/or remove heat from one or more heat-generating components of electronic device 1000, such as one or more processors 1010. In some embodiments, one or more cables 1082 can facilitate signals between fan assembly 1080 and the one or more processors 1010. As a result, one or more processors 1010 may use information from one or more sensors 1030 to control fan assembly 1080.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device, comprising:
a housing that defines an internal volume; and
a fan assembly located in the internal volume, the fan assembly comprising:
   an impeller comprising:
      a first impeller blade having a first blade geometry,
      a second impeller blade having a second blade geometry different from the first blade geometry, and
      a separating structure that separates the first impeller blade from the second impeller blade, wherein:
         the separating structure comprises an edge that defines an outer diameter, and
         the first impeller blade and the second impeller blade extend to the edge; and
   a fan housing comprising:
      a first fan inlet,
      a second fan inlet, wherein rotation of the impeller causes i) the first impeller blade to drive a first amount of air from the internal volume through the first fan inlet and ii) the second impeller blade to drive a second amount of air through the second fan inlet, the second amount of air different from the first amount of air, and
      an air flow separator surrounding the impeller and coupled with the fan housing, the air flow separator at least partially separating the first amount of air from the second amount of air.

2. The electronic device of claim 1, wherein:
the separating structure comprises a disc that comprises a first surface and a second surface opposite the first surface,
the first impeller blade is located on the first surface, and
the second impeller blade is located on the second surface.

3. The electronic device of claim 1, wherein:
the first blade geometry comprises a first leading edge oriented at a first angle, and
the second blade geometry comprises a second leading edge oriented at a second angle different from the first angle.

4. The electronic device of claim 1, wherein:
the first blade geometry comprises the first impeller blade having a first chord length, and
the second blade geometry comprises the second impeller blade having a second chord length different from the first chord length.

5. The electronic device of claim 1, further comprising:
a heat-generating component, wherein the fan assembly comprises a fan outlet, and the impeller is configured to drive air through the fan outlet to cool the heat-generating component.

6. An electronic device, comprising:
a housing that defines an internal volume;
a heat-generating component located in the internal volume; and
a fan assembly located in the internal volume and configured to cool the heat-generating component, the fan assembly comprising:
   a fan housing that defines a first fan inlet and a second fan inlet,
   an impeller located in the fan housing, the impeller comprising:
      a separating structure comprising a first surface and a second surface opposite the first surface,
      a first set of impeller blades extending from the first surface and aligned with the first fan inlet, the first set of impeller blades having a first impeller blade geometry, and
      a second set of impeller blades extending from the second surface and aligned with the second fan inlet, the second set of impeller blades having a second impeller blade geometry different from the first impeller blade geometry, and
   an air flow separator surrounding the impeller and coupled with the fan housing, the air flow separator at least partially separating a first amount of air entering the first fan inlet from a second amount of air entering the second fan inlet.

7. The electronic device of claim 6, wherein:
the first set of impeller blades comprises a first impeller blade having a first blade geometry, and
the second set of impeller blades comprises a second impeller blade having a second blade geometry different from the first blade geometry.

8. The electronic device of claim 7, wherein the separating structure defines a discontinuity between the first set of impeller blades and the second set of impeller blades.

9. The electronic device of claim 7, wherein:
the first impeller blade geometry comprises the first impeller blade having a first leading edge oriented at a first angle, and
the second impeller blade geometry comprises the second impeller blade having a second leading edge oriented at a second angle different from the first angle.

10. The electronic device of claim 7, wherein:
the first impeller blade geometry comprises the first impeller blade having a first trailing edge oriented at a first angle, and
the second impeller blade geometry comprises the second impeller blade having a second trailing edge oriented at a second angle different from the first angle.

11. The electronic device of claim 6, wherein:
the first set of impeller blades define a first impeller blade chord length, and
the second set of impeller blades define a second impeller blade chord length less than the first impeller blade chord length.

12. The electronic device of claim 6, wherein the separating structure comprises a disc that defines an edge, and each of the first set of impeller blades and each of the second set of impeller blades extend to the edge.

13. The electronic device of claim 6, wherein:
the first impeller blade geometry is defined, collectively, by a first diameter, and
the second impeller blade geometry is defined, collectively, by a second diameter different from the first diameter.

14. The electronic device of claim 13, wherein:
the first set of impeller blades comprises a first fan blade having a first edge oriented at a first angular position, and
the second set of impeller blades comprises a second impeller blade having a second edge oriented at a second angular position different from the first angular position.

15. The electronic device of claim 14, wherein the first edge defines a first leading edge, and the second edge defines a second leading edge.

16. The electronic device of claim 14, wherein the first edge defines a first trailing edge, and the second edge defines a second trailing edge.

17. The electronic device of claim 13, wherein:
the separating structure comprises a disc, and
the first set of impeller blades and the second set of impeller blades are integrally formed with the disc.

18. The electronic device of claim 13, wherein:
the first impeller blade geometry is defined by i) a first leading edge oriented at a first leading edge angle and ii) a first trailing edge oriented at a first trailing edge angle, and
the second impeller blade geometry is defined by i) a second leading edge oriented at a second leading edge angle different from the first leading edge angle and ii) a second trailing edge oriented at a second trailing edge angle different from the first trailing edge angle.

\* \* \* \* \*